US010815570B2

(12) United States Patent
Outten

(10) Patent No.: US 10,815,570 B2
(45) Date of Patent: Oct. 27, 2020

(54) LINEARIZED ENERGETIC RADIO-FREQUENCY PLASMA ION SOURCE

(71) Applicant: Denton Vacuum, L.L.C., Moorestown, NJ (US)

(72) Inventor: Craig A. Outten, Rydal, PA (US)

(73) Assignee: DENTON VACUUM, L.L.C., Moorestown, NJ (US)

( * ) Notice: Subject to any disclaimer, the term of this patent is extended or adjusted under 35 U.S.C. 154(b) by 209 days.

(21) Appl. No.: 16/184,177

(22) Filed: Nov. 8, 2018

(65) Prior Publication Data

US 2019/0145005 A1 May 16, 2019

Related U.S. Application Data

(60) Provisional application No. 62/585,126, filed on Nov. 13, 2017.

(51) Int. Cl.
| | |
|---|---|
| *C23C 16/505* | (2006.01) |
| *C23C 16/507* | (2006.01) |
| *H01J 37/32* | (2006.01) |
| *C23C 16/26* | (2006.01) |
| *C23C 16/54* | (2006.01) |

(52) U.S. Cl.
CPC ............ *C23C 16/505* (2013.01); *C23C 16/26* (2013.01); *C23C 16/507* (2013.01); *C23C 16/545* (2013.01); *H01J 37/3211* (2013.01); *H01J 37/32174* (2013.01); *H01J 37/32422* (2013.01); *H01J 37/32522* (2013.01); *H01J 2237/002* (2013.01); *H01J 2237/3321* (2013.01)

(58) Field of Classification Search
None
See application file for complete search history.

(56) References Cited

U.S. PATENT DOCUMENTS

| 5,036,252 A | 7/1991 | Lob | |
|---|---|---|---|
| 2002/0004309 A1* | 1/2002 | Collins | ............... H01J 37/3266 438/719 |
| 2006/0019477 A1* | 1/2006 | Hanawa | ............ H01J 37/32357 438/514 |

(Continued)

OTHER PUBLICATIONS

International Search Report and Written Opinion issued in Counterpart International Application No. PCT/US18/60728 dated Jan. 24, 2019.

*Primary Examiner* — Jose I Hernandez-Kenney
(74) *Attorney, Agent, or Firm* — Hoffmann & Baron, LLP

(57) ABSTRACT

A plasma ion source includes a plasma chamber body having at least one inlet for introducing a feed gas to an interior of the plasma chamber body. The plasma chamber body is electrically isolated from a vacuum chamber attached to the plasma chamber body. An inductive antenna in an interior of the plasma chamber body is configured to supply a source of electromagnetic energy as a function of an RF voltage supplied thereto. The plasma ion source includes an extraction grid disposed at an end of the plasma chamber body. A voltage difference between the extraction grid and plasma chamber body accelerates charged species in a plasma discharge to generate an output quasi-neutral plasma ion beam. A bias voltage applied to the plasma chamber body includes a portion of the RF voltage supplied to the antenna combined with a pulsed DC voltage.

25 Claims, 8 Drawing Sheets

(56) References Cited

U.S. PATENT DOCUMENTS

2014/0124363 A1* 5/2014 Abarra .............. H01J 37/32412
                                                                               204/298.04
2016/0111241 A1* 4/2016 Likhanskii .............. H01J 37/08
                                                                               250/423 R
2016/0233047 A1* 8/2016 Tang .................... H01J 37/3211

* cited by examiner

LINEARIZED ENERGETIC RADIO-FREQUENCY PLASMA ION SOURCE

CROSS-REFERENCE TO RELATED APPLICATIONS

This application claims the benefit of U.S. Provisional Patent Application No. 62/585,126 filed on Nov. 13, 2017 and entitled "Linearized Energetic Radio-Frequency Inductive Plasma Ion Source," the complete disclosure of which is expressly incorporated herein by reference in its entirety for all purposes.

FIELD

The present invention relates generally to the electrical, electronic and computer arts, and, more particularly, to methods and apparatus for generation of a gas discharge (plasma).

BACKGROUND

Plasma systems are of significance for production, processing and treatment of solid-state materials, among other applications. Plasma reactors, also known as plasma sources, can be used in many plasma processing applications, including, but not limited to, growth of thin films, dispersion, etching and cleaning. Plasma sources are generally used for the deposition of thin film materials by plasma-enhanced chemical vapor deposition (PECVD), whereas ion sources are typically employed for the treatment of surfaces to change their wettability, remove contamination or residual cleaning solvents, and to improve adhesion of coatings and thin film materials, among other applications.

Chemical vapor deposition (CVD) is a well-known technique used for depositing thin film materials. CVD typically employs a liquid chemical precursor that is vaporized into a gas. CVD can be performed at atmospheric pressure or under vacuum conditions. In many conventional CVD processes, thermal energy is required to initiate the chemical reactions that result in deposition on a substrate surface; the thermal energy can be supplied by resistive heaters or radiant lamps, for example. Generally, the substrate must be heated to a temperature of several hundreds to thousands of degrees Celsius in order to cause the precursor gas to chemically react and form a thin film coating on the substrate surface. The heated substrate, in this scenario, acts as the primary energy source for CVD. Surface chemical reactions are the key drivers of film deposition; vapor phase reactions in the gaseous state are generally undesirable and lead to the formation of particles which often lead to defects in the deposited thin film.

In contrast, a plasma discharge acts as the primary energy source in PECVD. Plasma is an ionized gas consisting primarily of positively charged ions and negatively charged electrons. A plasma is commonly classified as "hot" if it is nearly fully ionized, or "cold" if only a small fraction of gas molecules (e.g., on the order of about one percent) are ionized. Generally, plasmas utilized for PECVD are "cold" low temperature plasmas. However, the electrons in "cold" plasmas possess energies (i.e., temperatures, in the context of plasma physics), typically on the order of tens of electron volts (eV). Free electrons in the plasma have sufficient energy to initiate chemical reactions in the gaseous precursor that result in deposition on a substrate at much lower substrates temperatures compared to CVD. Additionally, positive ions in the plasma discharge bombard the substrate and transfer their momentum to the growing film. This momentum transfer, however, generally does not increase the temperature of the substrate. Furthermore, the ions generally possess low energies, typically on the order of tens of electron volts.

In a PECVD process, it can be desirable to increase the energy of ions impinging on the substrate during deposition to thereby tailor one or more properties of the thin film coating. Conventional plasma sources for PECVD lack the capability to increase the energy of ions without applying a voltage to the substrate, commonly referred to as substrate biasing. While substrate biasing may be effective for static (i.e., stationary) small area (e.g., less than about one square meter) substrates, such techniques are impractical for use in industrial vacuum coaters, such as, for example, web or inline coaters, where large area substrates (e.g., flexible webs, display glass, architectural glass, vehicle glass, photovoltaic panels, etc.) move through the coater.

SUMMARY

One or more embodiments of the present invention involve techniques for depositing thin film coatings over large areas by plasma-enhanced chemical vapor deposition (PECVD) using a linear, self-neutralized energetic plasma ion source whose ion energy and ion current density (i.e., ion flux) can be varied continuously and independently of one another. A plasma ion source, according to one or more embodiments, is well-suited for ion beam assisted chemical vapor deposition (IBACVD); specifically, for depositing mechanically durable and scratch-resistant coatings, such as, for example, diamond-like carbon (DLC) and diamond-like nanocomposite (DLN) thin films on glass and polymeric substrates.

An exemplary linearized energetic plasma ion source, according to an embodiment of the invention, comprises a plasma chamber body that is electrically isolated from a vacuum chamber to which the plasma chamber body is attached, the plasma chamber body serving as an electrode of the plasma ion source and being adapted to receive a bias voltage applied thereto. An inductive antenna is disposed in an interior of the plasma chamber body and is configured to supply a source of electromagnetic energy to an interior of the plasma chamber body. The antenna is operative to sustain a plasma discharge confined within the interior of the plasma chamber body as a function of a radio frequency (RF) voltage supplied to the antenna, the bias voltage applied to the plasma chamber body supplying an electrostatic potential to charged species in the plasma discharge. The plasma ion source further includes an extraction grid disposed at an end of the plasma chamber body opposite the inductive antenna. The extraction grid is at a same voltage potential as the vacuum chamber, a difference in potential between the extraction grid and the plasma chamber body being configured to accelerate the charged species in the plasma discharge out of the extraction grid to generate an output quasi-neutral plasma ion beam. A bias mixer is coupled with the plasma chamber body, the bias mixer combining a portion of the RF voltage supplied to the antenna with a pulsed direct current (DC) voltage to generate the bias voltage applied to the plasma chamber body.

As may be used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Various units, circuits, modules, or other components may be described herein as being "configured to" perform a particular task or tasks. In such contexts, the term "configured to" is intended to be construed broadly as a recitation of structure generally meaning "having circuitry or hardware that" performs the particular task or tasks during operation. As such, the unit, circuit, module, or component can be configured to perform the subject task or tasks even when the unit, circuit, module, or component is not currently powered on. In general, circuitry or hardware that forms the structure corresponding to "configured to" may include hardware circuits and/or memory storing program instructions executable to implement the stated operation. Similarly, various units, circuits, modules, or components may be described as performing a task or tasks, for convenience in the description. Such descriptions should be interpreted as including the phrase "configured to." Reciting a unit, circuit, module, or component that is configured to perform one or more tasks is expressly intended not to invoke a 35 U.S.C. § 112, paragraph (f) interpretation for that unit, circuit, module, or component.

Techniques according to embodiments of the present invention provide substantial beneficial technical effects. By way of example only and without limitation, one or more embodiments of the invention achieve one or more of the following, among other benefits:

- An RF plasma ion source that generates a self-neutralized ion beam without the need for a secondary or auxiliary electron source to compensate for the positive space charge of the ion beam;
- An RF plasma ion source that is capable of independent control of ion current density (i.e., ion flux) and ion energies;
- An RF plasma ion source that is configured to generate an energetic ion beam without the need for substrate biasing, and is therefore suitable for depositing films on large area moving substrates;
- An RF plasma ion source that is capable of depositing films requiring energetic ion bombardment during film nucleation and growth to provide for beneficial properties, such as but not limited to scratch-resistance, hardness, hydrophobicity, etc.;
- An RF plasma ion source that is capable of stable operation when depositing electrically insulating coatings or films over extended periods of operation (e.g., tens of hours or more) without maintenance.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
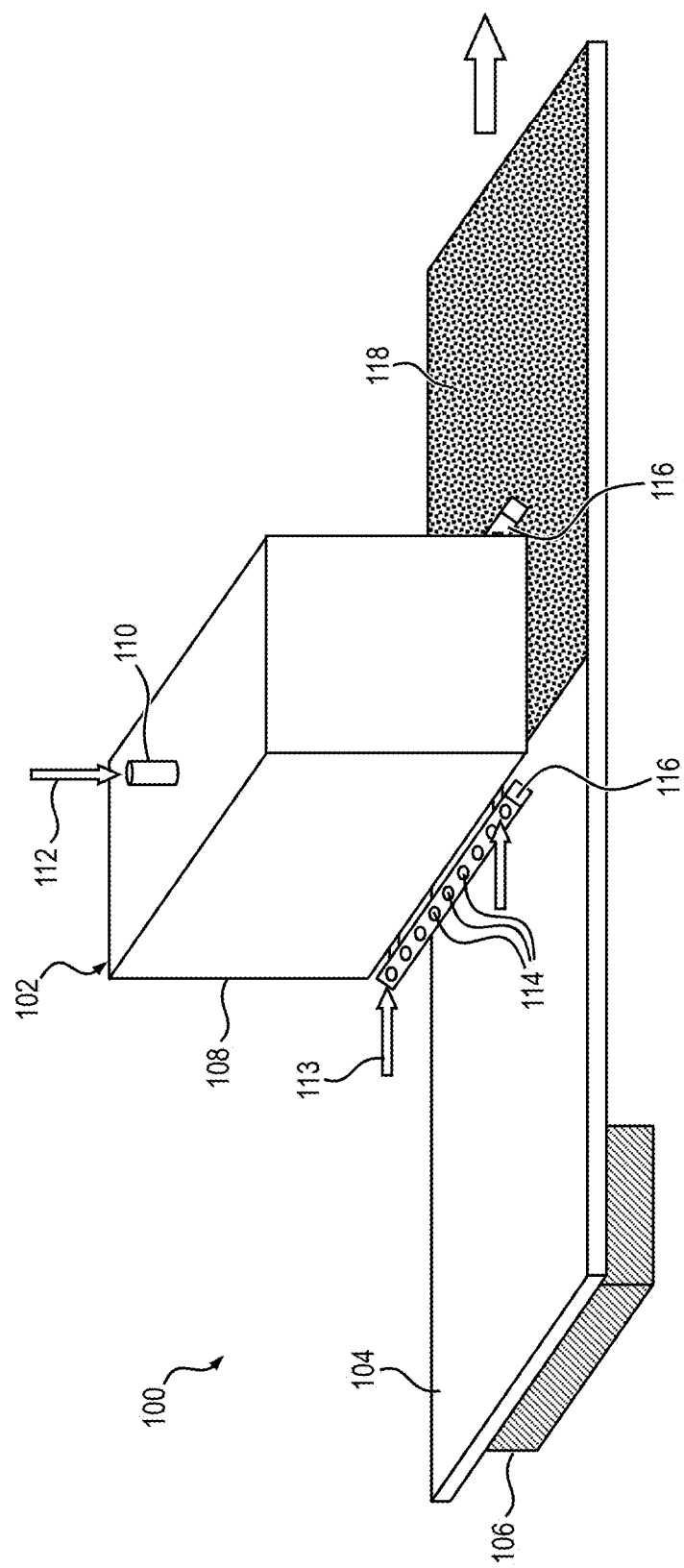
FIG. 1 is a perspective view conceptually depicting at least a portion of an illustrative apparatus including a linearized radio frequency (RF) driven plasma ion source used for treating the surface of a substrate, according to an embodiment of the present invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF PREFERRED EMBODIMENTS

Principles of the present invention will be described herein in the context of illustrative apparatus and methods for generating a quasi-neutral, linearized energetic beam of radio frequency (RF) charged ions over large coverage areas for use in depositing thin film coatings by plasma-enhanced chemical vapor deposition (PECVD). In one or more embodiments, methods and apparatus are provided which beneficially enable independent control of ion current density and ion energy by a novel application of combined pulsed direct current (DC) and RF voltages to a plasma chamber body serving a source electrode. It is to be appreciated, however, that the invention is not limited to the specific apparatus, systems and/or methods illustratively shown and described herein. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

As a preliminary matter, for purposes of clarifying and describing embodiments of the invention, the following table provides a summary of certain acronyms and their corresponding definitions, as the terms are used herein:

Table of Acronym Definitions

| Acronym | Definition |
| --- | --- |
| RF | Radio-frequency |
| CVD | Chemical vapor deposition |
| PECVD | Plasma-enhanced chemical vapor deposition |
| IBACVD | Ion beam assisted chemical vapor deposition |
| DLC | Diamond-like carbon |
| DLN | Diamond-like nanocomposite |
| DC | Direct current |
| AC | Alternating current |
| MHz | Megahertz |
| KHz | Kilohertz |
| kV | Kilovolts |
| pF | Picofarad |
| SCCM | Standard cubic centimeters per minute |

Throughout the detailed description, certain terms are used, the definitions of which may be explicitly provided. Where a term is not explicitly defined herein, a plain meaning of the term is intended, as that term is commonly used in the context of the relevant technology area, as will be understood by those skilled in the art.

For example, the term "plasma" as used herein is intended to be construed broadly and to encompass an ionized or partially ionized gas comprising positive ions and free electrons in proportions resulting in more or less no overall electric charge. In other words, a plasma generally consists of equal numbers of positive and negative charges and a different number of un-ionized neutral molecules.

The term "substrate" as used herein is intended to be construed broadly and to encompass a substance or layer to be coated. A substrate may rigid or flexible and can comprise, for example, a glass, polymer, metal, semiconductor, or any other material that can be coated or otherwise modified in some manner.

The term "ion beam assisted chemical vapor deposition (IBACVD)" as used herein is intended to be construed broadly and to encompass a chemical vapor deposition (CVD) process that employs an energetic quasi-neutral ion beam to assist with two distinct but related plasma-chemical processes: 1) the fragmentation, excitation, and ionization of gaseous precursor vapor introduced in the vicinity of a substrate material; and 2) densification, modification, and chemical activation of precursor species that condense on the surface of the substrate material to form a continuous dense thin film coating.

The term "radio frequency (RF)" as used herein is intended to be construed broadly and to encompass the application of electric power from a radio frequency generator where the signal (e.g., voltage and current) is changing at some frequency in a manner that is sinusoidal. Voltage variations are generally from negative to positive. In one or more disclosed embodiments, a frequency of the RF signal employed is about 2 MHz, although embodiments of the invention are not limited to any specific frequency. For example, in one or more other embodiments, commercial RF plasma generators having frequencies of 4 MHz, 13.56 MHz, 27.12 MHz, and 40 MHz can be similarly employed.

The term "inductive antenna" as used herein is intended to be construed broadly and to encompass a passive component that couples electromagnetic or RF energy in the form of time-varying magnetic (or inductive) fields into another body. In one or more embodiments, an intended body is a plasma discharge comprised of ionized gas species. In one or more embodiments, the inductive antenna is comprised of a multi-turn water cooled copper tubing having a geometrical shape of a rectangle, square, or cylinder, and preferably a rectangular shape with a width less than its length. It is to be understood that embodiments of the invention are not limited to any specific geometrical shape or dimensions of the inductive antenna, as will become apparent to those skilled in the art given the teachings herein.

The term "Faraday shield" as used herein is intended to be construed broadly and to encompass a conductive mesh or enclosure with slits or other openings (i.e., apertures) therein that is placed between the inductive antenna and the plasma to thereby reduce capacitive (or electric field) coupling between the windings of the inductive antenna and the plasma. In one or more embodiments, the Faraday shield is comprised of a metal possessing high electrical conductivity, such as, for example, aluminum or copper. Furthermore, in one or more embodiments, the Faraday shield is comprised of discrete elements that are disposed around the inductive antenna at periodic intervals. Other embodiments of a Faraday shield may be similarly employed, as will become apparent to those skilled in the art given the teachings herein.

The term "pulsed DC" as used herein is intended to be construed broadly and to encompass an application of electric power from a direct current (DC) power supply that is commonly generated, for example, from a half-wave rectifier or full-wave rectifier, although the waveform may not necessarily be sinusoidal (e.g., square wave, pulse train, etc.). A pulsed DC signal has characteristics of both DC and alternating current (AC) signals. The voltage of a DC signal is generally constant, whereas the voltage of an AC signal changes at some frequency in a manner that is sinusoidal. Similar to an AC signal, a pulsed DC signal varies continually, but in a manner resembling the DC signal, the sign of the voltage is generally constant. The voltage variations in a pulsed DC signal generally resemble a square waveform. Various pulsed DC signals can be employed with a unipolarity voltage output (positive or negative), generally referred to as unipolar, and a bi-polarity voltage output (positive and negative), generally referred to as bipolar. In the case of a bipolar signal, pulsed DC generators deliver voltage outputs in which a magnitude of the positive and negative voltages are equal (generally referred to as symmetrical) or unequal (generally referred to as asymmetrical). In one or more illustrative embodiments of the invention, an asymmetrical bipolar pulsed DC generator is employed with a frequency range of about 5 KHz to 350 KHz.

The term "feed gas" as used herein is intended to be construed broadly and to encompass a gas that is directly introduced into a plasma chamber body of a plasma ion source and comprises the plasma discharge generated by the RF inductive antenna. In one or more embodiments of the invention, the feed gas may be comprised of a pure gas, such as, but not limited to, argon, oxygen, nitrogen and/or other ionizable gases, or mixtures of one or more of the aforementioned gases. It is to be appreciated that embodiments of the invention are not limited to any specific gas or mixture of gases, as will become apparent to those skilled in the art given the teachings herein.

The term "precursor gas" as used herein is intended to be construed broadly and to encompass a gas in molecular form comprising chemical elements or elements that produce another compound. In one or more embodiments, the compound is condensed onto a substrate and forms a solid coating that may be referred to by those skilled in the arts as a thin film layer or layers.

As previously stated, in a PECVD process it can be desirable to increase the energy of ions impinging on the substrate during deposition to thereby tailor one or more properties of the thin film coating. Conventional plasma sources for PECVD, however, lack the capability to increase the energy of ions without employing substrate biasing (i.e., applying a voltage to the substrate). Most conventional linear plasma sources for PECVD, especially for the deposition of dielectric thin films, have limited capability to independently increase ion energies without negatively impacting operation of the plasma source. Such conventional linear plasma and ion sources include, without limitation, anode layer sources, end-hall sources, gridded ion sources, magnetron plasma sources, hollow cathode sources, microwave sources, RF capacitive and inductive sources and closed drift sources. While some of these sources have been successfully used for plasma treatment and ion-assisted physical vapor deposition applications, they are significantly less effective for PECVD processing of substrates, due at least in part to unstable operation resulting from the deposition of insulating film on their internal and external components and inadequate neutralization of the ion beam space charge over their length.

For instance, anode layer and end-hall sources are difficult to operate and have had limited application for at least the above-noted reasons. RF (capacitive-type and inductive-type) sources have been utilized primarily for small-scale substrates, for example, semiconductor wafers. However, this approach has experienced difficulty in scaling up to wide area substrates, due at least in part to the complexity and cost of impedance matching, very slow deposition rates and generation of particulates, among other factors. Microwave sources and hollow cathode sources have been utilized for processing of photovoltaic panels and architectural glass, respectively. However, these sources generally produce low-energy ions (e.g., less than about 15-25 eV), and the source apparatus does not have the capability for independent acceleration of ions. Magnetron plasma sources and closed drift-type sources possess limited capability for independent control of ion energy. Generally, ion energies are related to the discharge voltage and operational pressure of the source. Therefore, a limited process window exists to adjust ion energy. Gridded ion sources are generally used for plasma treatment or ion assist during a physical vapor deposition process, for example sputtering or evaporation. Application of these sources for PECVD processes has been limited due at least in part to the unstable operation of the source resulting from the deposition of insulating film on the extraction grids and/or source components (internal or external). Additionally, gridded sources exhibit uneven neutralization over wide area substrates due at least in part to the use of a point electron source for space charge compensation.

Aspects of the invention provide apparatus and methods for depositing thin film coatings over large areas (e.g., greater than about 0.4 meters) by PECVD using a geometrically linear, self-neutralized plasma ion source configured such that ion energy and ion current density can be varied continuously and independently. More specifically, one or more embodiments of the invention employ an inductively-coupled plasma ion source to generate a high-density and non-thermal plasma of ions, electrons and neutral gas particles. In one or more embodiments, the inductively coupled plasma is created and sustained by an RF-driven antenna disposed in the interior of a body constructed of a conductive material. The body forms a plasma chamber that is mechanically rigid, vacuum tight, and cost effective to manufacture.

In one or more embodiments, the plasma ion source is externally attached, via a mounting flange or other attachment means, onto a vacuum chamber in which pressures of about $10^{-6}$ to $10^{-8}$ Torr are preferably maintained.

A plasma ion source according to embodiments of the invention is advantageously suited for use in an IBACVD process that can deposit mechanically durable and scratch-resistant coatings, for example diamond-like carbon (DLC) and diamond-like nanocomposite (DLN) thin films, on large area glass and polymeric substrates. For industrial scale processes, embodiments of the present invention can create a uniform and stable energetic quasi-neutral beam of ions over considerable lengths (e.g., greater than 0.4 meters).

FIG. 1 is a perspective view conceptually depicting at least a portion of an illustrative apparatus 100 including a linearized RF driven plasma ion source 102 for use in an IBACVD application, according to an embodiment of the invention. The RF driven plasma ion source 102 is positioned proximate a translating (i.e., moving or non-stationary) substrate 104. In one or more embodiments, the substrate 104 is preferably moved, relative to the plasma ion source 102, in a direction which is substantially parallel to a lower surface of the plasma ion source facing an upper surface of the substrate 104, such as, for example, using a transport mechanism 106. The transport mechanism 106 may comprise, but is not limited to, a conveyor belt, a table and a motor configured to drive the table, a roll-to-roll (R2R) assembly, etc. Other suitable mechanisms and methods for translating the substrate 104 relative to the plasma ion source 102 will become apparent to those skilled in the art, including the use of a moving plasma ion source with a stationary substrate, etc. Substrates 104 suitable for use in conjunction with embodiments of the invention include, but are not limited to, flexible webs, display glass, architectural glass, vehicle glass, photovoltaic panels, etc.

The plasma ion source 102 includes a plasma chamber body 108 adapted to generate and sustain a plasma discharge therein. In one or more embodiments, the plasma chamber body 108 is formed of an electrically conductive material (e.g., metal) and is shaped substantially as a hollow rectangular cuboid. Other shapes and dimensions of the plasma chamber body 108 are similarly contemplated (e.g., cylindrical).

The plasma chamber body 108 includes one or more inlets 110 through which a feed gas 112 to be ionized is introduced. A precursor gas 113 is introduced through one or more gas inlets 114, which may be distributed using a manifold 116 or the like, interposed between the plasma chamber body and the substrate 104. The manifold 116 and corresponding precursor gas inlets 114 can be affixed to the plasma chamber body 108, or positioned using other means. A plasma ion beam (not explicitly shown, but implied) comprised of feed gas ions, electrons, and neutral species, interacts with the precursor gas and initiates plasma-chemical reactions that result in the deposition of a thin film coating 118 on the upper surface of the substrate 104. In one or more embodiments, multiple manifolds 116 and corresponding precursor gas inlets 114 are employed (e.g., on opposite sides of the plasma chamber body 108) to thereby provide a more uniform coating 118, or otherwise facilitate more precise control over the IBACVD process.

Figure 2:
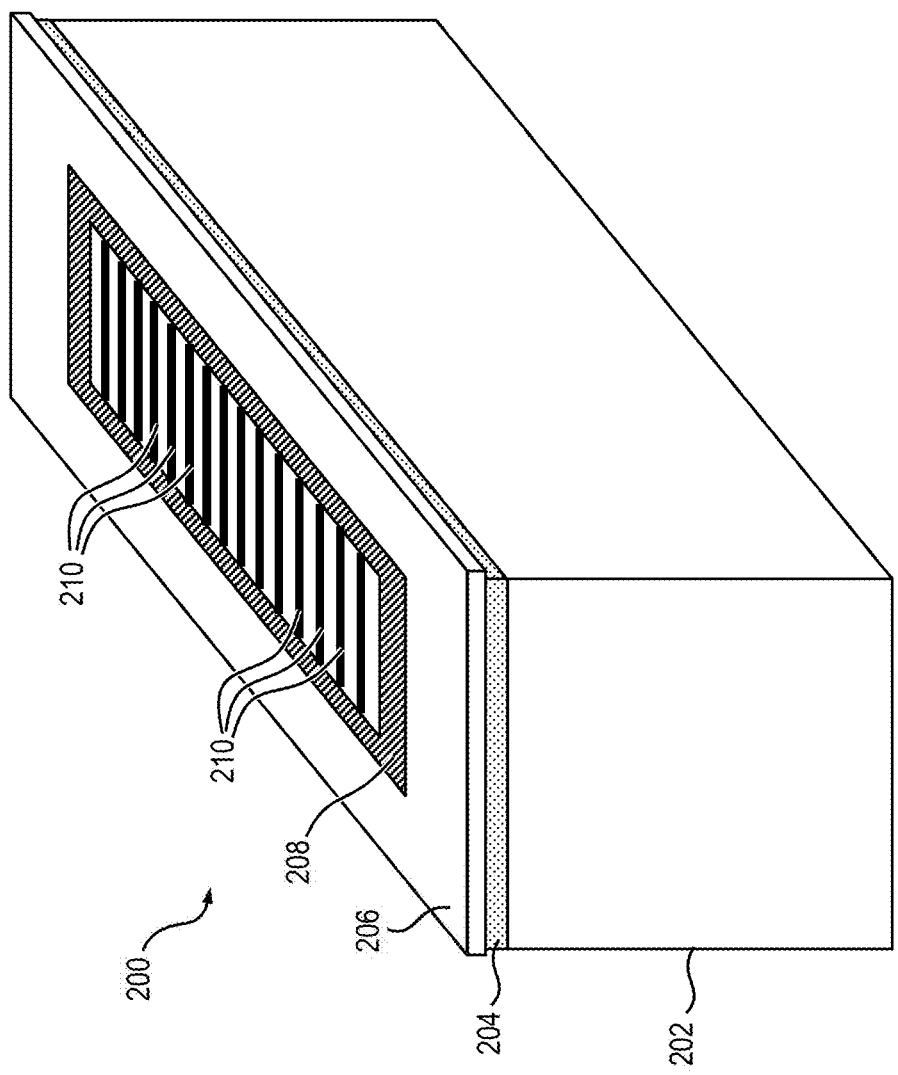
FIG. 2 is an isometric view depicting at least a portion of an illustrative linearized RF driven plasma ion source suitable for implementing the exemplary plasma ion source shown in FIG. 1, according to an embodiment of the present invention.

FIG. 2 is an isometric view depicting at least a portion of an illustrative linearized RF driven plasma ion source 200 suitable for implementing the plasma ion source 102 shown in FIG. 1, according to an embodiment of the invention. With reference to FIG. 2, the plasma ion source 200, which is shown inverted from its position of operation shown in FIG. 1, includes a plasma chamber body 202 adapted to generate and sustain a plasma discharge therein. In one or more embodiments, the plasma chamber body 202 is formed of a conductive material (e.g., metal) and is shaped as a hollow rectangular cuboid. Other shapes and dimensions of the plasma chamber body 202 are similarly contemplated.

In one or more embodiments, the plasma chamber body 202 is electrically isolated from a vacuum chamber (not explicitly shown) within which the plasma ion source operates, using an insulating vacuum flange 204. The insulating vacuum flange 204, in one or more embodiments, is comprised of aluminum oxide or other rigid ceramic, ULTEM® (an amorphous thermoplastic polyetherimide (PEI) material), polymeric material, glassy material, or any other rigid materials that are machinable and exhibit high dielectric strength (e.g., about 3.0 at 1.0 MHz for ULTEM®, or about 9.1 at 1.0 MHz for aluminum oxide), low RF dissipation factor (e.g., about 0.0015 at 1.0 MHz for ULTEM®, or about 0.0007 at 1.0 MHz for aluminum oxide), high mechanical strength (e.g., compressive stress of greater than about 150 megapascals (MPa) for ULTEM®, or about 2,100 MPa for aluminum oxide), high serviceable temperature (e.g., maximum use temperature of greater than about 1,700 degrees Celsius, for aluminum oxide or ULTEM®), and high electrical resistivity (e.g., volume resistivity of greater than about $10^{14}$ ohm-cm, for aluminum oxide or ULTEM®), among other properties. In one or more embodiments, the vacuum flange 204 comprises an amorphous thermoplastic, polyetherimide material. It is contemplated that various other materials can be utilized in forming the vacuum flange 204, such as, but not limited to, polytetrafluoroethylene and aluminum oxide.

The insulating vacuum flange 204 is interposed between the plasma chamber body 202 and a vacuum chamber mating flange 206. The vacuum chamber mating flange 206, in one or more embodiments, is adapted for coupling the plasma ion source 200 with the vacuum chamber (not explicitly shown) and is preferably comprised of a mechanically rigid and non-magnetic metal that is vacuum compatible, such as, for example, a non-magnetic stainless steel.

The plasma ion source 200 further includes a grid extraction assembly 208. In one or more embodiments, the grid extraction assembly 208 is comprised of a plurality of electrically conductive rods 210 which preferably possess low sputter yield. In embodiments of the invention in which the plasma chamber body 202 is grounded, the conductive rods 210 are electrically isolated from the plasma chamber body, so that a voltage potential difference can be applied between the grid extraction assembly and the plasma chamber body to thereby accelerate charged ions out of the plasma ion source 200 in the form of an ion beam.

In one or more embodiments, the conductive rods 210 are comprised of a metallic material (e.g., graphite). The conductive rods 210 are preferably disposed along an opening of the grid extraction assembly 208 at periodic intervals. By way of example only and without limitation, a spacing between respective geometric centers of the conductive rods 210 varies between about 3 mm and 7 mm. Optionally, in one or more embodiments, the grid extraction assembly 208 is cooled, such as, for example, with a vacuum sealed water cooling circuit integrated into the vacuum mating flange 206 or integrated into the vacuum chamber door (not explicitly shown, but implied), or with a heat sink or the like, to thereby remove heat generated in the grid extraction assembly 208 during operation of the plasma ion source 200.

Figure 3:
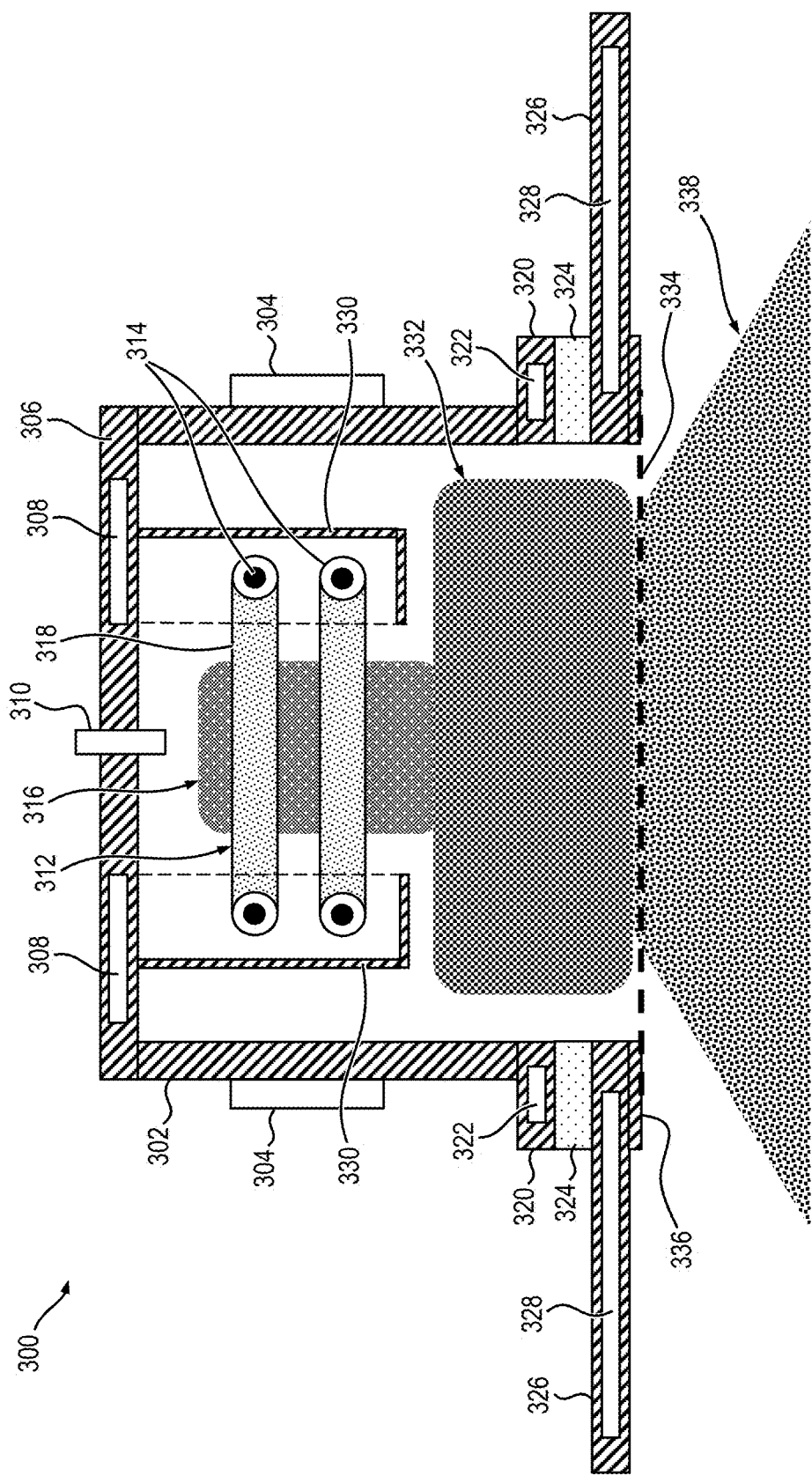
FIG. 3 is a cross-sectional view depicting at least a portion of an illustrative plasma ion source apparatus, according to an embodiment of the present invention.

FIG. 3 is a cross-sectional view depicting at least a portion of an illustrative plasma ion source 300 used in the deposition of thin film coatings, according to an embodiment of the invention. During operation, the plasma ion source 300 is generally mounted on a vacuum chamber (not explicitly shown, but implied), or otherwise placed within the vacuum chamber. In a manner consistent with the plasma ion source 200 shown in FIG. 2, the plasma ion source 300 includes a plasma chamber body 302 adapted to generate and sustain a plasma discharge therein. The plasma chamber body 302 is preferably formed of a conductive material (e.g., metal) and is shaped as a hollow rectangular cuboid, although embodiments of the invention are not limited to any specific shapes and/or dimensions. The plasma chamber body 302, in one or more embodiments, is comprised of a high electrical and thermal conductivity metal, preferably aluminum, which serves as a vacuum chamber for the apparatus. In one or more embodiments, the plasma chamber is manufactured from vacuum-grade aluminum and has vacuum seals (e.g., elastomeric O-rings). Therefore, the plasma chamber, itself, functions as a vacuum chamber.

In one or more embodiments, one or more cooling channels 304, or an alternative heat removal mechanism (e.g., heat sink), are disposed (e.g., by welding or another fastening means) onto an exterior surface (i.e., atmospheric side) of, and in thermal contact with, the plasma ion source 300 and are configured to prevent overheating of the plasma chamber body 302. Overheating of the plasma ion source 300 can result in thermal degradation of vacuum sealing components (e.g., elastomeric O-rings, not explicitly shown) that can result in a loss of vacuum integrity. In the disclosed embodiments of the invention, water is the preferred cooling fluid for the apparatus, although other cooling fluids (e.g., chlorofluorocarbon (CFC) refrigerants, ethylene glycol, propylene glycol, ammonia, etc.) can be similarly employed.

In one or more embodiments, a source flange 306 is secured to the plasma chamber body 302 utilizing, for example, a high-temperature O-ring seal, such as, but not limited to, a fluoropolymer elastomer or an alternative fastening means known by those skilled in the art. In one or more embodiments, the source flange 306 is removable from the plasma chamber body 302 to facilitate access to an interior of the plasma chamber body, such as for maintenance and/or repair of plasma ion source components (e.g., inductive antenna, etc.). Optionally, cooling channels 308 are formed (e.g., machined) in the source flange 306. The cooling channels 308 are adapted to remove heat from the plasma ion source 300, such as, for example, by circulating liquid (e.g., water) or gas (e.g., air) through the cooling channels. The source flange 306 further includes one or more inlets 310 through which a feed gas to be ionized is introduced into an interior of the plasma chamber body 302.

The plasma ion source 300 further includes an inductive antenna 312 configured to supply a source of electromagnetic energy to an interior of the plasma chamber body 302 when an RF signal is applied to the antenna. The antenna 312 is preferably suspended within the plasma chamber body 302 using suitable mounting hardware, such as a bracket or the like, as will become apparent to those skilled in the art. The antenna 312 is preferably electrically isolated from the plasma chamber body 302. In one or more embodiments, the antenna 312 is disposed on the source flange 306, which facilitates easy removal of the antenna when the source flange is removed. A shape of the inductive antenna 312 preferably matches a shape of the plasma chamber body 302; that is, a rectangular cuboid, in one or more exemplary embodiments. It is to be understood, however, that embodiments of the invention are not limited to any particular shape or dimension of the antenna 312.

The antenna 312 preferably comprises a plurality of windings (i.e., turns) 314 of conductive wire or tubing; the more windings used to form the antenna, the more efficient the inductive coupling, and therefore the greater the electromagnetic energy transferred to the interior of the plasma chamber body 302. In one or more embodiments, the antenna 312 is water-cooled. For example, the windings 314 of the antenna 312 may be formed of hollow copper tubing through which cooled water or another liquid is passed to thereby transfer heat away from the antenna, thereby preventing thermal damage to one or more components of the plasma ion source (e.g., vacuum seals, etc.). In this manner, the antenna 312 is adapted for operation at high RF power levels (e.g., greater than about 1000 watts).

When an RF signal is applied to the antenna 312, such as from an external RF generator (not explicitly shown), RF energy which is inductively coupled into the plasma chamber body 302 ionizes the feed gas and forms a high-density plasma discharge 316. The plasma discharge 316 is primarily contained within an interior space between the windings 314 of the antenna 312. In one or more embodiments, the antenna 312 includes hollow aluminum oxide (alumina) tubing 318, or tubing formed of an alternative electrical insulator, which encases the copper windings 314. In an alternative embodiment, at least a portion of the conductive windings 314 are coated with a layer of electrically insulating material. The aluminum oxide tubing 318, being an electrical insulator, serves to protect the portion of the copper windings 314 that is exposed to the plasma discharge 316 from being sputtered onto the surface of a substrate (e.g., 104 in FIG. 1). Without the protective aluminum oxide tubing 318, the copper windings 314 would be sputtered by ions in the plasma discharge 316, which would result in vacuum and water leakage into the plasma chamber body 302 and vacuum chamber (not explicitly shown).

A portion of the antenna windings 314 is arranged external to the plasma chamber body 302 and provides electrical connection to the RF generator, as well as connection to a cooling liquid source (not explicitly shown for clarity). For example, the copper windings 314 of the antenna 312, in one or more embodiments, is arranged into the plasma chamber body 302 utilizing vacuum feedthroughs (not explicitly shown, but implied). The vacuum feedthroughs are formed of an insulating material (e.g., ceramic) so that the copper windings 314 do not make electrical connection with the plasma chamber body 302 which is preferably conductive (thereby preventing an electrical short between the antenna 312 and plasma chamber body 302).

With continued reference to FIG. 3, in one or more embodiments a vacuum mating flange 320, with optional cooling channels 322, is disposed (e.g., welded or otherwise fastened) onto the plasma chamber body 302 to provide for a vacuum mating surface to a dielectric vacuum break 324. In a manner consistent with the formation of the cooling channels 308 formed in the source flange 306, the cooling channels 322, which may be machined into the vacuum mating flange 320 or attached externally thereto, are adapted to remove heat from the plasma ion source 300, such as, for example, by circulating liquid (e.g., water) or gas (e.g., air) through the cooling channels.

The dielectric vacuum break 324 is comprised of an electrically insulating material, such as, but not limited to, a polymer, ceramic, glass or other dielectric material, that is preferably vacuum tight, machinable and mechanically rigid. In one or more embodiments, the dielectric vacuum break 324 comprises a high-temperature thermoplastic material. In one or more embodiments, the dielectric vacuum break 324 is disposed between the plasma chamber body 302 and a vacuum chamber door 326. Optionally, the vacuum chamber door 326 is formed having cooling channels 328. In a manner consistent with the formation of the cooling channels 308 and 322 formed in the source flange 306 and vacuum flange 320, respectively, the cooling channels 328, which may be machined into the vacuum chamber door 326 or attached externally thereto, are adapted to remove heat from the vacuum chamber, such as, for example, by circulating liquid (e.g., water) or gas (e.g., air) through the cooling channels. One advantage of employing a vacuum chamber door 326 is to provide ease of access for cleaning the plasma ion source 300 and placing of substrates (e.g., 104 shown in FIG. 1) on fixtures (not explicitly shown) in the vacuum chamber.

In the illustrative embodiment shown in FIG. 3, the plasma chamber body 302 is electrically isolated from the vacuum chamber door 326 and vacuum chamber (not explicitly shown, but implied) using the dielectric vacuum break 324. By electrically isolating the plasma chamber body 302 from vacuum chamber door 326 and vacuum chamber (not shown), which are electrically grounded (preferably to earth ground), the plasma chamber body 302 can be biased to a prescribed voltage level without the need for substrate biasing or providing for an internal source electrode (not shown) disposed inside of the plasma chamber body 302. Hence, the plasma chamber body 302 itself, which is directly biased using an external bias voltage supply (not explicitly shown), serves as a source electrode, as previously stated. Other mechanisms for electrically isolating the plasma chamber body 302 from the vacuum chamber are similarly contemplated, as will become apparent to those skilled in the art.

The plasma ion source 300 includes an arrangement of electrostatic shields 330, referred to herein as a Faraday shield, disposed between the inductive antenna 312 and the plasma chamber body 302, surrounding the antenna. In one or more embodiments, the Faraday shield 330 is formed having slots or apertures therein and is rectangular in shape, or otherwise preferably matched to the shape of the plasma chamber body 302. The Faraday shield 330 functions, at least in part, to reduce a capacitive voltage that develops between the windings 314 of the antenna 312 and to permit only inductive fields and voltages to enter the interior of the plasma chamber body 302 where the plasma discharge 316 is formed. In addition, the Faraday shield 330 provides a relatively constant electrical impedance between the antenna 312 and the plasma discharge 316, which facilitates fast and repeatable ignition of the working (feed) gas introduced inside the plasma chamber body 302. The Faraday shield 330 also reduces ion energies for better control of material deposition. The inductive antenna 312, plasma chamber body 302 and Faraday shield 330, in one or more embodiments, form a plasma generation unit that is configured to create and sustain the high-density plasma discharge 316 used to form a quasi-neutral plasma ion beam generated by the plasma ion source 300. In one or more embodiments, the Faraday shield 330 is comprised of a metal with high electrical and thermal conductivity (e.g., aluminum or copper).

The high-density plasma discharge 316 is generated by the inductive antenna 312 and resides in relative proximity to the antenna. An afterglow plasma 332 is disposed between the inductive antenna 312 and an extraction grid 334. The afterglow plasma 332 is comprised of a lower concentration of electrons and ions from the high-density plasma discharge 316 generated by the inductive antenna 312. In one or more embodiments, the extraction grid 334 comprises a single grid or mesh of conductive material having apertures or openings therein (e.g., holes, slits, etc.) configured to enable the extraction of a quasi-neutral plasma beam. Various conductive (e.g., metallic) materials are contemplated by embodiments of the invention, including, for example, tungsten, molybdenum, graphite, titanium, and alloys thereof. The use of a single extraction grid 334, as opposed to multiple extraction grids, beneficially eliminates the need for precise alignment of the extraction grids to one another, as is conventionally required.

In a preferred embodiment, the extraction grid 334 is formed in a manner consistent with the grid extraction assembly 208 shown in FIG. 2. Specifically, the extraction grid 334, in one or more embodiments, comprises a plurality of electrically conductive rods (e.g., 210 in FIG. 2) which preferably possess low sputter yield. A voltage potential difference applied between the extraction grid 334 and the plasma chamber body 302 controls, at least in part, an acceleration of charged ions out of the plasma ion source 200 in the form of an ion beam 336. In one or more embodiments, the conductive rods forming the extraction grid 334 are comprised of a metallic material, such as, for example, graphite. As described in conjunction with FIG. 2, the conductive rods are preferably disposed along an opening of the extraction grid 334 at periodic intervals, such as with a spacing between geometric centers of adjacent rods of about 3 mm to 7 mm. It is to be appreciated, however, that embodiments of the invention are not limited to any specific conductive material or configuration of the extraction grid 334.

The extraction grid 334 is secured in place by a grid assembly 338. The grid assembly 338, in one or more embodiments, is configured as a "picture frame," with the extraction grid 334 disposed on an interior of the frame, and is affixed on the vacuum chamber door 326, such as using standard attachment means. Ions and electrons comprised in the afterglow plasma 332 are accelerated through the extraction grid 334, which is electrically connected to the vacuum chamber (not shown) and grounded (preferably to earth ground). Ions and electrons are biased at a prescribed voltage potential difference between the "biased" plasma chamber body 302 and the electrically grounded extraction grid 334, as previously stated, to thereby generate a quasi-neutral plasma ion beam 336 as an output of the plasma ion source 300 for use in IBACVD applications.

As previously explained, the plasma chamber body 302 is electrically isolated from the vacuum chamber, which is electrically grounded, preferably to earth ground potential. An interior of the plasma chamber body 302 is configured having a surface area which is larger relative to a surface area of the extraction grid 334, which is electrically grounded via its mechanical attachment to the vacuum chamber body. In one or more embodiments, a surface area ratio of the interior surface area of the plasma chamber body 302 is about 1.5 to 5 times a surface area of the extraction grid 334, preferably at least 3 to 5 times. When this surface area ratio is met, a positive polarity self-bias develops on the plasma chamber body 302 when an RF voltage is applied to it.

As will be described in further detail herein, in one or more embodiments, a portion of the RF voltage applied to the inductive antenna 312 is capacitively coupled to the plasma chamber body 302 via a variable capacitor with a capacitance preferably in a range of between about 5-1000 pF. This arrangement provides a cost-effective method to apply an RF voltage to the plasma chamber body 302 to provide selective control of the plasma potential relative to the grounded extraction grid 334 with a single RF power supply or generator. The positive polarity self-bias beneficially repels positive ions that are generated by the RF inductive discharge 316 from sputtering the interior surfaces of the plasma chamber body 302. In addition, the electrons in the inductive discharge 316 are generally accelerated towards the plasma chamber body 302; however, a fraction of these electrons are accelerated away from the plasma chamber body 302 and to the extraction grid 334.

In accordance with aspects of the invention, a sufficient fraction of the electrons accelerated towards the grid 334 are extracted to compensate or neutralize the positive space charge that is generated by extracted positive ions along the entire length of the extraction grid assembly. Hence, a high-current density, quasi-neutral, linear and large area beam of ions is generated as an output of the plasma ion source 300. Aspects of the invention provide a simultaneous and concomitant extraction of electrons and positive ions of balanced charge density to prevent space charge-related arcing on ground surfaces, fixtures and substrates.

Conventionally, a point-electron neutralizer (e.g., thermionic filament, hollow cathode, or plasma bridge neutralizer) is required to neutral the space charge, the point-electron neutralizer typically disposed adjacent to the plasma or ion source. While this approach may be sufficient for small-area substrates, it has been difficult to achieve uniform space charge neutralization using this conventional method over large-area substrates. Hence, the resulting ion beam can undesirably exhibit non-uniform ion current density which can lead to uneven surface treatment and poor film quality across the substrate. In addition, localized space charge arching can occur which can damage the substrate, vacuum hardware and plasma ion source.

Figure 4:
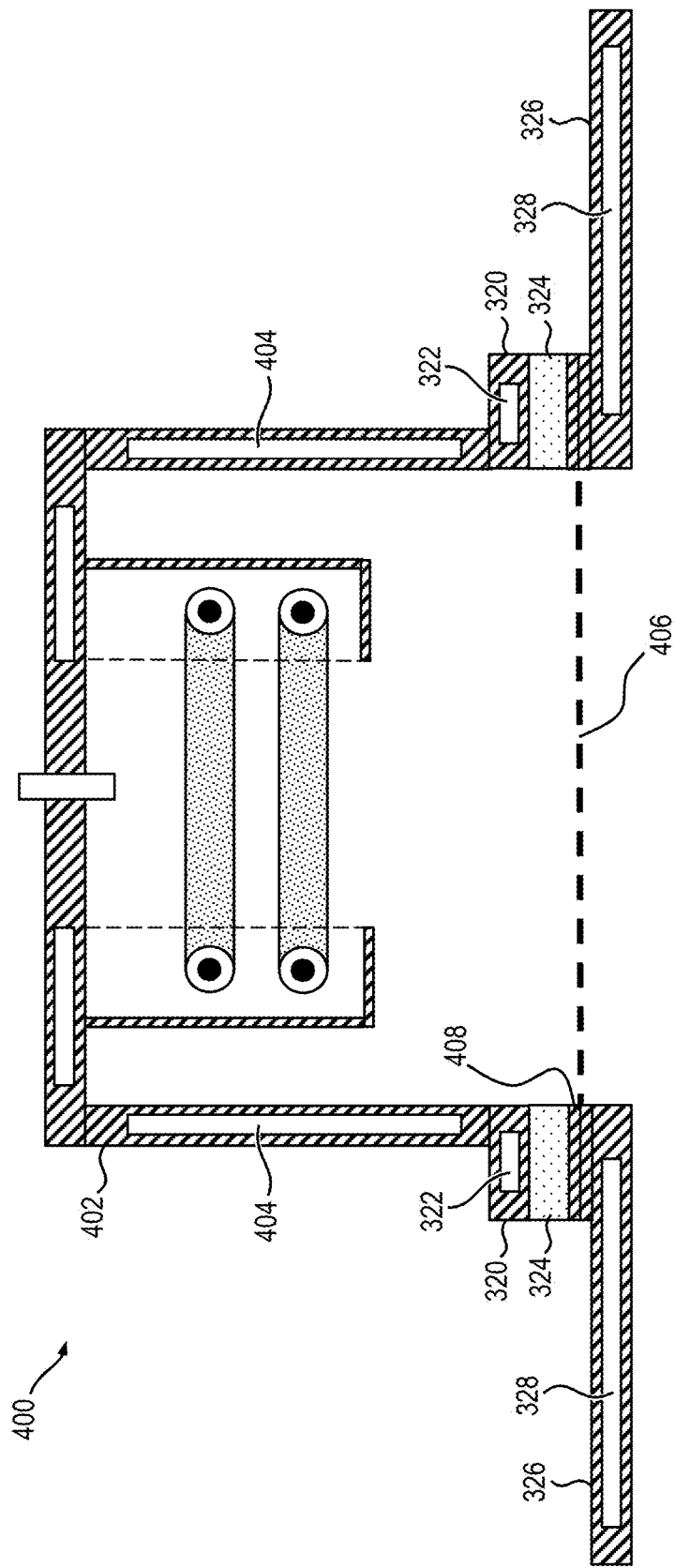
FIG. 4 is a cross-sectional view depicting at least a portion of an illustrative plasma ion source apparatus with improved thermal management, according to an embodiment of the present invention.

FIG. 4 is a cross-sectional view depicting at least a portion of an illustrative plasma ion source 400 with enhanced thermal management, according to an embodiment of the invention. Specifically, the plasma ion source 400 comprises a plasma chamber body 402 including one or more cooling channels 404 integrated into one or more respective sidewalls of the plasma chamber body. The cooling channels 404 are adapted to remove heat from the plasma ion source 400, such as, for example, by circulating a liquid (e.g., water) or gas (e.g., air) through the cooling channels. Integrating the cooling channels into the plasma chamber body 402 eliminates the need for cooling channels disposed externally on the plasma chamber body (e.g., (e.g., 304 in FIG. 3). Having the cooling channels 404 formed integrally with the plasma chamber body 402 enables the plasma ion source 400 to achieve superior thermal management and cooling efficiency compared to the arrangement shown in FIG. 3. In one or more embodiments, water is employed as the cooling fluid conveyed by the cooling channels 404, although other cooling fluids are similarly contemplated, as will be known by those skilled in the art.

The plasma ion source 400 further includes an extraction grid 406, which may be formed in a manner consistent with the extraction grid 334 shown in FIG. 3. To improve thermal cooling of the extraction grid 406, an extraction grid assembly 408, which may be formed in a manner consistent with the grid assembly 338 described in conjunction with FIG. 3, is disposed between the plasma chamber vacuum mating flange 320 with integrated cooling channels 322 and a vacuum chamber, preferably a vacuum chamber door 326 with integrated cooling channels 328 to facilitate maintenance of the apparatus.

In the plasma ion source 400, thermal conduction of heat from the extraction grid 406 is improved, compared to the exemplary plasma ion source 300 depicted in FIG. 3, due at least in part to the modified arrangement of the extraction grid assembly 408. Specifically, the grid assembly 408 is disposed between two cooled elements; namely, the vacuum mating flange 320 and the vacuum chamber door 326, both having integrated cooling channels 322 and 328, respectively. As in the plasma ion source 300 shown in FIG. 3, the plasma ion source 400 shown in FIG. 4 includes a dielectric vacuum break 324 disposed between the vacuum mating flange 320 and the grid assembly 408 for electrically isolating the plasma chamber body 402 from the vacuum chamber door 326 and vacuum chamber (not explicitly shown, but implied).

The extraction grid (e.g., 406 in FIGS. 4 and 334 in FIG. 3) is resistively heated during extraction of the plasma ion beam (e.g., 336 in FIG. 3). Heating of the extraction grid 406, 334 can result in thermal degradation and mechanical warping, which can decrease serviceable lifetime of the plasma ion source. Improved cooling of the extraction grid 406 therefore beneficially enables the plasma ion source 400 to be operated at increased RF power levels to achieve higher coating deposition rates, among other important benefits. Vacuum sealing is provided for in the grid assembly 408 in one or more embodiments of the invention. An advantage of the disclosed embodiment is that the plasma ion source 400 including the grid assembly 408 and extraction grid 406 is an integral assembly to facilitate ease of mounting to the vacuum chamber door 326.

Figure 5:
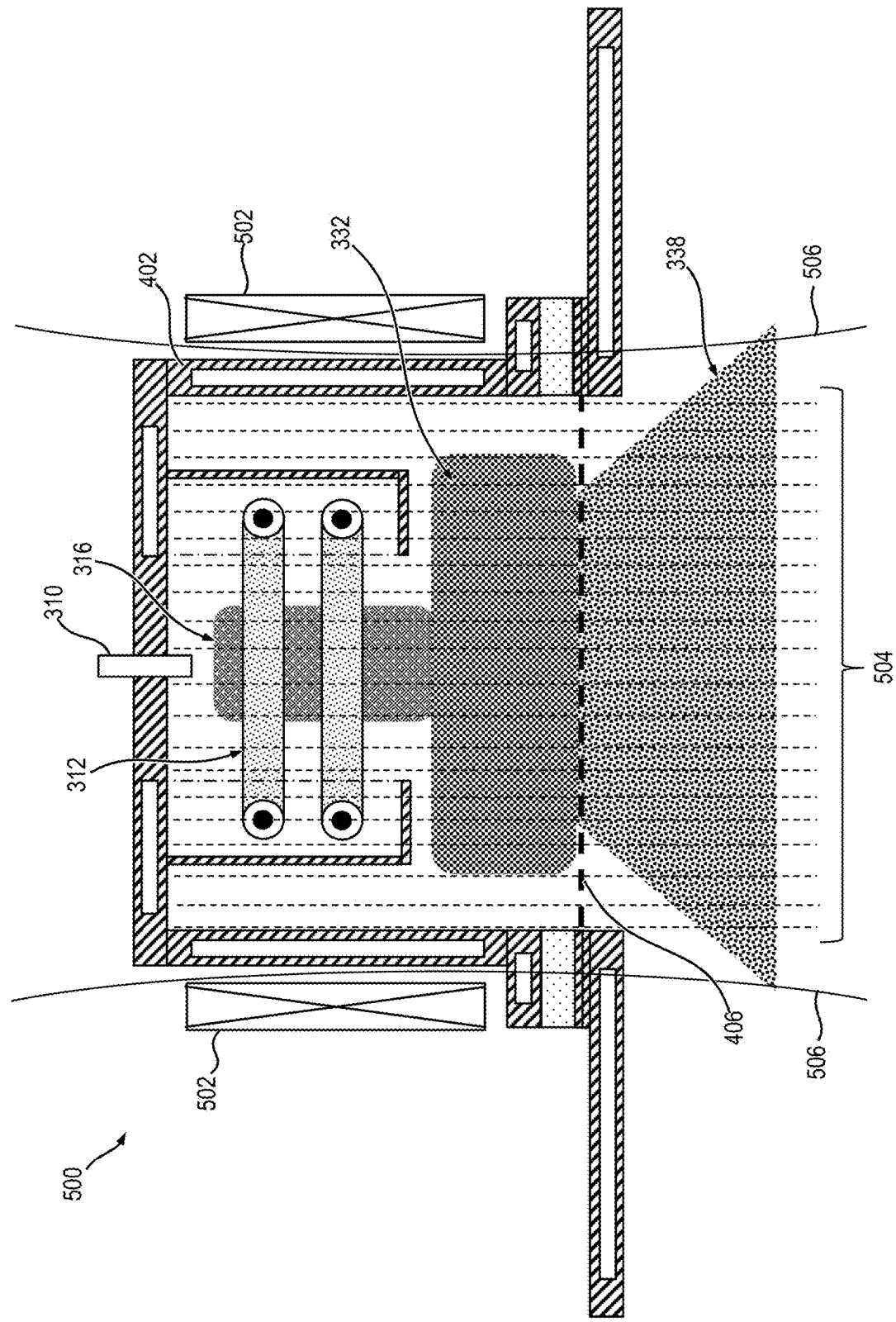
FIG. 5 is a cross-sectional view depicting at least a portion of an illustrative plasma ion source apparatus with magnetic enhancement, according to an embodiment of the present invention.

FIG. 5 is a cross-sectional view depicting at least a portion of an illustrative plasma ion source 500 with magnetic enhancement, according to an embodiment of the invention. The plasma ion source 500 is configured in a manner consistent with the exemplary plasma ion source 400 shown in FIG. 4, but includes a magnetic enhancement feature which enables the plasma ion source 500 to achieve superior control over the deposition process, and thus represents an improvement over the plasma ion source 400. Specifically, the plasma ion source 500, in one or more embodiments, comprises an electromagnet 502 disposed around the plasma chamber body 402 to produce a magnetic field in an interior of the plasma ion source 500. Magnetic field lines 504 extend out of the plasma chamber body 402 and exit through the extraction grid 406; an envelope of the magnetic field 506 is also shown. In other embodiments, a permanent magnet array or a combination of electromagnets and/or permanent magnets can be employed.

The magnetic field generated by the electromagnet/permanent magnet array 502 provides an increase in plasma density of the plasma discharge 316 generated by the inductive antenna 312. Electrons produced in the plasma discharge 316 cannot cross over the magnetic field lines 504, and instead the electrons gyrate around and along the field lines 504. Electrons move in cycloid trajectories along the magnetic field lines 504, from the plasma discharge 316 to the afterglow plasma 332, then passing through the extraction grid 406 to form the plasma ion beam 338 generated by the plasma ion source 500. One consequence of the cycloid motion of electrons is a longer path length for electrons to interact with feed gas injected into the plasma chamber body 402 through the one or more feed gas inlets 310. A longer path length for electrons provides an increased probability for electrons to collide with feed gas molecules and ionize and/or excite them. These collisions lead to higher plasma densities in the inductive plasma discharge 316, afterglow plasma 332, and plasma ion beam 338. Hence, the plasma ion source 500 is advantageously adapted to produce higher ion current densities using lower RF power levels compared to previously disclosed embodiments on the invention. Higher ion current densities can provide for higher deposition rates. In addition to reduced RF power consumption, the plasma ion source 500 with magnetic enhancement is able to achieve reduced bias power, reduced feed gas and precursor gas consumption, among other benefits.

Figure 6:
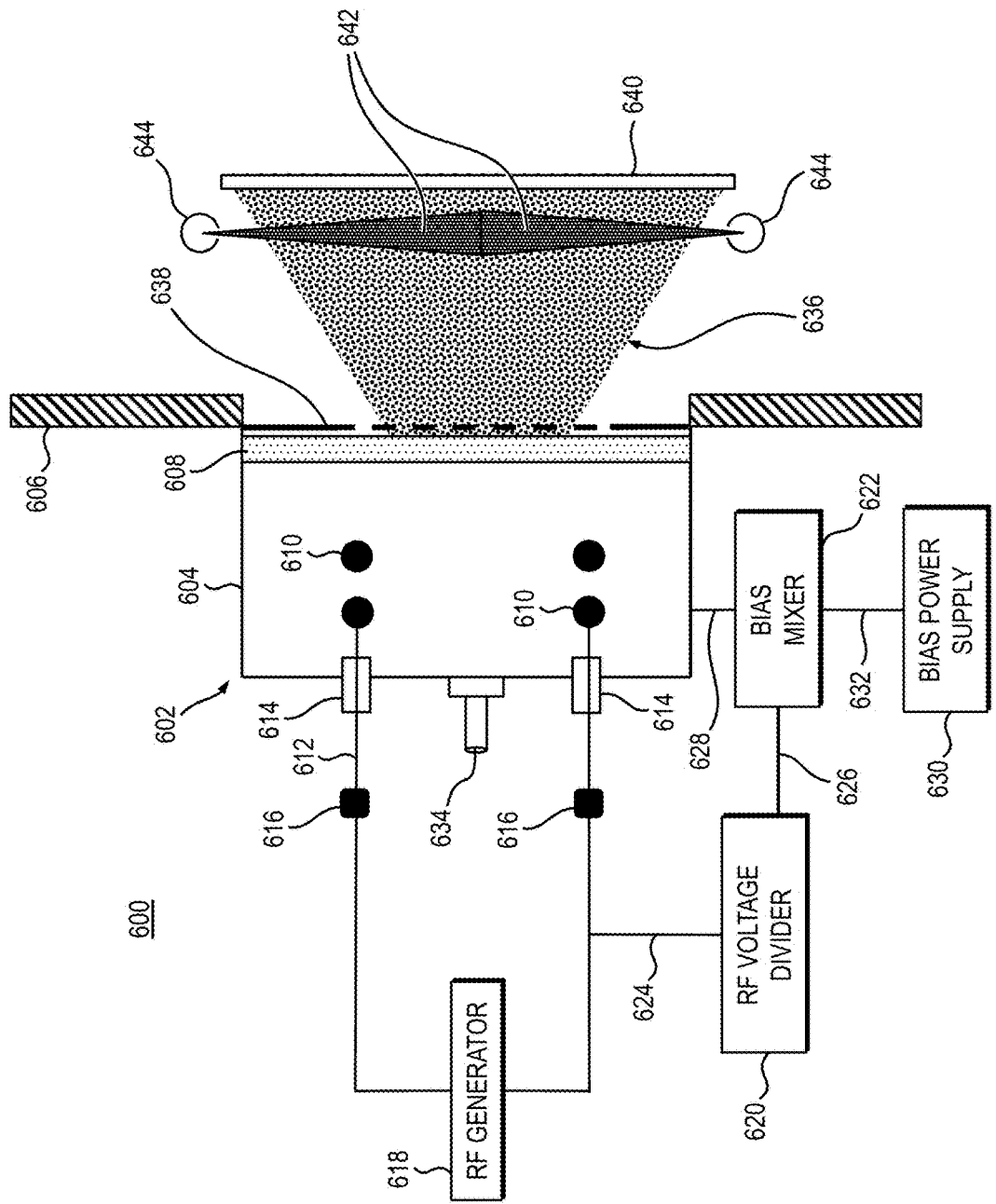
FIG. 6 is a block diagram conceptually depicting at least a portion of an illustrative inline coater or box coater system including a linearized RF driven plasma ion source according to an embodiment of the present invention.

With reference now to FIG. 6, a block diagram conceptually depicts at least a portion of an illustrative inline coater or box coater system 600 including a linearized RF driven plasma ion source 602, according to an embodiment of the invention. The plasma ion source 602 may be formed in a manner consistent with any of the exemplary plasma ion sources 300, 400 or 500 depicted in FIG. 3, 4 or 5, respectively. The plasma ion source 602 includes a plasma chamber body 604 which is electrically isolated from a vacuum chamber 606 utilizing a dielectric vacuum break mating flange 608, or alternative isolation means. The dielectric vacuum break mating flange 608, in one or more embodiments, is comprised of an electrically insulating material, such as, but not limited to, a polymer, ceramic, glass or other dielectric material, that is preferably vacuum tight, machinable and mechanically rigid. In one or more embodiments, the dielectric vacuum break mating flange 608 comprises a high-temperature thermoplastic material. The dielectric vacuum break mating flange 608 may be formed in a manner consistent with the dielectric vacuum break 324 shown in FIGS. 3 and 4.

The plasma ion source 602 further includes an inductive antenna 610 configured to supply a source of electromagnetic energy to an interior of the plasma chamber body 604 when an RF signal is applied to the antenna. The antenna 610 is preferably suspended within the plasma chamber body 604 using a suitable mounting means and is formed in a manner consistent with the inductive antenna 312 described in conjunction with FIG. 3. Specifically, the antenna 610 preferably comprises a plurality of windings (i.e., turns) of conductive wire or tubing. In one or more embodiments, the windings of the inductive antenna 610 are formed of hollow copper tubing through which cooled liquid (e.g., water) is passed to thereby transfer heat away from the antenna. The inductive antenna 610, in one or more embodiments, is electrically isolated from the plasma chamber body 604.

In one or more embodiments, copper tubing leads 612 from the inductive antenna 610 are extended out through the plasma chamber body 604 utilizing corresponding vacuum seals 614 with high temperature fluoropolymer O-rings (not explicitly shown, but implied), or the like. Cooling liquid connections are preferably made to the antenna tubing leads 612 using insulating polymer tubing (not explicitly shown, but implied) to maintain electrical isolation of the plasma chamber body 604 from the inductive antenna 610. Electrical connections 616 between the antenna tubing leads 612 and an external RF generator 618 are comprised of, for example, copper straps, coaxial cables, or other connection means. A matching network (not explicitly shown) is optionally coupled with the RF generator 618 and is comprised of capacitive elements that are configured to improve the transfer of RF power from the RF generator to the inductive antenna 610 and the plasma discharge generated within the plasma chamber body 604.

In one or more embodiments, a portion of the power delivered to the antenna 610 by the RF generator 618 is used (e.g., tapped) for biasing the plasma ion source 602. The plasma ion source 602 is biased, in this embodiment, by applying a bias voltage directly to the plasma chamber body 604. To accomplish this, an RF voltage divider 620 is preferably connected between the RF generator 618 and the plasma chamber body 604 via a bias mixer 622 coupled between the RF voltage divider and the plasma chamber body. The RF voltage divider 620 is preferably electrically connected to the RF generator 618 using a shielded coaxial connection 624 or similar connection arrangement, the RF voltage divider 620 is electrically connected to the bias mixer 622 using a shielded coaxial cable 626, or alternative connection arrangement, and the bias mixer 622 is preferably electrically connected to the plasma chamber body 604 using a shielded coaxial cable 628 or the like. Although embodiments of the invention contemplate the use of non-shielded connections (e.g., copper strap) between the various RF components, using shielded connections is preferable for reducing electromagnetic interference caused by RF radiation emanating from the unshielded connections. In one or more embodiments, the RF voltage divider 620 comprises a high-voltage capacitive element(s), preferably operative in a voltage range of about 3-5 kV, in which the capacitance is variable from about 10-1000 pF. Alternative voltage divider architectures are similarly contemplated, as will become apparent to those skilled in the relevant art.

The bias mixer 622, in one or more embodiments, comprises filtering and attenuation low-inductance RF circuitry which is configured to combine a portion of the RF voltage output from the RF voltage divider 620 with a bias voltage delivered by a bias power supply 630 coupled with the bias mixer. The bias power supply 630 is electrically connected to the bias mixer 622 using a shielded coaxial cable 632, or an alternative connection arrangement. The mixed bias voltage output from the bias mixer 622 provides for acceleration of ions and electrons from the feed gas plasma discharge that is generated by the inductive antenna 610. Feed gas is introduced into the plasma chamber body 604 via a gas manifold 634, or arrangement (e.g., one or more gas inlets). In one or more embodiments, the bias voltage can be adjusted from 0-600 V, although it is to be appreciated that embodiments of the invention are not limited to any specific bias voltages. The voltage signal produced by the bias power supply 630 may comprise either a constant DC voltage, in one or more embodiments, or a varying DC voltage, previously described herein as a pulsed DC signal.

In accordance with one or more aspects of the invention, ion flux (i.e., ion current density) and ion energy of the resulting plasma ion beam are distinct and independently controlled. For example, ion flux is dependent primarily on RF voltage coupled from the inductive antenna 610 by the voltage divider 620, while ion energy is dependent primarily on bias voltage generated by the bias power supply 630. These two voltage components are uniquely combined using the bias mixer 622 and supplied to the plasma chamber body 604.

A quasi-neutral ion beam 636 generated by the plasma ion source 602 is comprised of energetic positive ions, excited neutral gas particles, and electrons from the feed gas plasma discharge generated by the inductive antenna 610. The positive ions are accelerated by an extraction grid assembly 638, which is preferably formed in a manner consistent with the extraction grid 334 shown in FIG. 3 or 406 shown in FIGS. 4 and 5, into a region between the plasma ion source 600 and a substrate 640 to be coated with a dense thin film. In one or more embodiments, the plasma ion beam 636 interacts with a precursor gas 642 introduced through a separate precursor gas manifold 644 disposed adjacent to and in front of the substrate 640 surface to be coated. The plasma ion beam 636 initiates and drives non-thermal plasma chemical reactions in the precursor gas 642 that result in the formation of a thin film coating on the substrate 640 surface.

In one or more aspects of the invention, one improvement upon standard plasma ion sources is the capability to deposit dense solid thin film materials, such as, for example, diamond-like carbon (DLC) and diamond-like nanocomposite (DLN), without the need for applying an additional bias voltage to the substrate 640. An application of embodiments of the invention to large area substrates has many benefits and applications, which will become apparent to those skilled in the art given the teachings herein. A wide variety of substrate materials can be used, including polymers with low melting temperatures, since the IBACVD method according to aspects of the present invention is beneficially performed without a need for supplemental heating.

A plasma ion source formed in accordance with aspects of the invention has many benefits and applications. For instance, the plasma ion beam emanating from the plasma ion source according to embodiments of the invention is self-neutralized along the length of its extraction grid (e.g., 638 in FIG. 6), which thereby eliminates the need for electron neutralization from a separate source (e.g., thermionic filament, hollow cathode, or plasma bridge neutralizer). Due to the use of an RF-driven inductive discharge, dense plasmas with high ion densities (e.g., greater than about $10^{11}$ $cm^{-3}$) are generated that tend to be uniform over the length of the plasma ion source. This feature is important for all applications where uniformity of deposition, surface treatment, or other use is required. Substrate widths of 0.5 meters or more can be uniformly coated or treated.

During operation, ion current density and ion energy is uniform across the width of the substrates and can be independently controlled relative to one another, as previously stated. Therefore, the plasma ion source according to embodiments of the invention tends to advantageously exhibit a wide process window. The plasma ion source further operates over a wide process pressure window, preferably, but not limited to, about 5 mTorr to 30 mTorr. This pressure range is similar to sputter a source which facilitates the integration of the inventive plasma ion source with production inline, batch and web coating vacuum systems with multiple processes.

The continuous deposition of electrically insulating IBACVD films, such as DLC or DLN, can cause process drift, operational instabilities, arcing, or shutting off of the plasma ion source over time. According to aspects of the invention, the extraction grid assembly (e.g., 406 in FIGS. 4 and 5) reduces the flow of condensable precursors that deposit insulating films into the plasma ion source by presenting a restrictive conductance to precursor gas molecules. Additionally, the RF bias applied to the plasma ion source can be varied during deposition to control adverse changes in operation of the plasma ion source due, at least in part, to deposition of insulating films inside the plasma ion source. This control feature provides a beneficial way to maintain repeatable and consistent operation of the plasma ion source and extend maintenance activities, scheduled and unscheduled. The beneficial and useful ability to independently control the ion energy for the promotion of IBACVD processes that provide for dense solid dielectric films with excellent optical performance, mechanical robustness, and environmental durability without the requirement for substrate biasing is advantageous for the high volume manufacturing of a variety of industrial applications, such as, for example, hard anti-reflective films for cover glass employed in devices with touch-screen displays, among other useful applications.

Example 1

By way of example only and without limitation, a DLC coating formed on a top surface of a glass substrate using the illustrative plasma ion source 300 depicted in FIG. 3 is described in further detail below. For this example, it is assumed that the plasma ion source 300 has a total length of about 635 mm and a width of about 178 mm; a distance between the extraction grid 334 and the top surface of the glass substrate was fixed at about 172 mm. Argon feed gas was supplied to the plasma ion source 300 via a ceramic multi-bore aluminum oxide feed tube 310 at a rate of about 80 standard cubic centimeters per minute (sccm). The precursor gas was supplied to the vacuum chamber via a precursor gas feed tube with a length of about 483 mm disposed adjacent to a stationary non-magnetic stainless steel substrate holder with a length of about 431 mm and a width of about 305 mm. The precursor gas feed tube was arranged at a distance of about 83 mm in front of a top surface of the substrate holder and disposed at a distance of about 171 mm in front of the extraction grid 334 of the plasma ion source 300; the precursor gas was 100% butane.

The extraction grid of the plasma ion source was comprised of graphite rods (e.g., 210 in FIG. 2) with diameters of about 3 mm and lengths of about 228 mm; the extraction grid array has an overall length of about 506 mm. The substrate upon which a DLC coating was formed was a microscope slide comprised of optical borosilicate crown glass (BK-7 glass). The substrate was secured to a substrate holder with polyimide tape. The substrate holder was electrically grounded. The RF generator (e.g., 618 in FIG. 6) used was a remote plasma source (RPS) 2 MHz RF generator manufactured by Advanced Energy of Fort Collins, Colo. (Advanced Energy Litmas® RPS 1501). The bias power supply (e.g., 630 in FIG. 6) used was a pulsed DC power supply manufactured by Advanced Energy (Advanced Energy Pinnacle® Plus+), which was configured with positive polarity output and had an output frequency range of about 5-350 kHz. Results of the exemplary coating process are shown in Table 1 below.

TABLE 1

DEPOSITION PARAMETERS FOR THIN FILM COATING

| BUTANE GAS FLOW (SCCM) | PROCESS PRESSURE (MTORR) | RF POWER (WATTS) | DC BIAS VOLTAGE (VOLTS) | COATING TIME (MIN) | AVERAGE COATING THICKNESS (ANGSTROMS) |
|---|---|---|---|---|---|
| 65 | 18 | 1000 | 200 | 60 | 2896 |

As can been seen from Table 1 above, a thin film coating of DLC was deposited on a stationary glass substrate for 60 minutes to produce a DLC thin film that is 2,896 Angstroms thick. A scratch resistance of the DLC thin film was qualitatively assessed by passing a fresh razor blade over the top surface and inspecting the surface with an optical microscope. The film surface did not exhibit scratches during inspection. Also, the adhesion of the DLC thin film was qualitatively evaluated by applying masking tape to the surface of the glass substrate, pulling off the masking tape, and inspecting in an optical microscope. No film was removed upon inspection of the surface where the masking tape had been applied.

While this exemplary embodiment has been described with reference to specific operating parameters and details noted above, it is to be appreciated that embodiments of the invention are not restricted to the specific parameters and details set forth, but include various changes and modifications that may become apparent to those skilled in the art given the teachings herein.

Example 2

Figure 7:
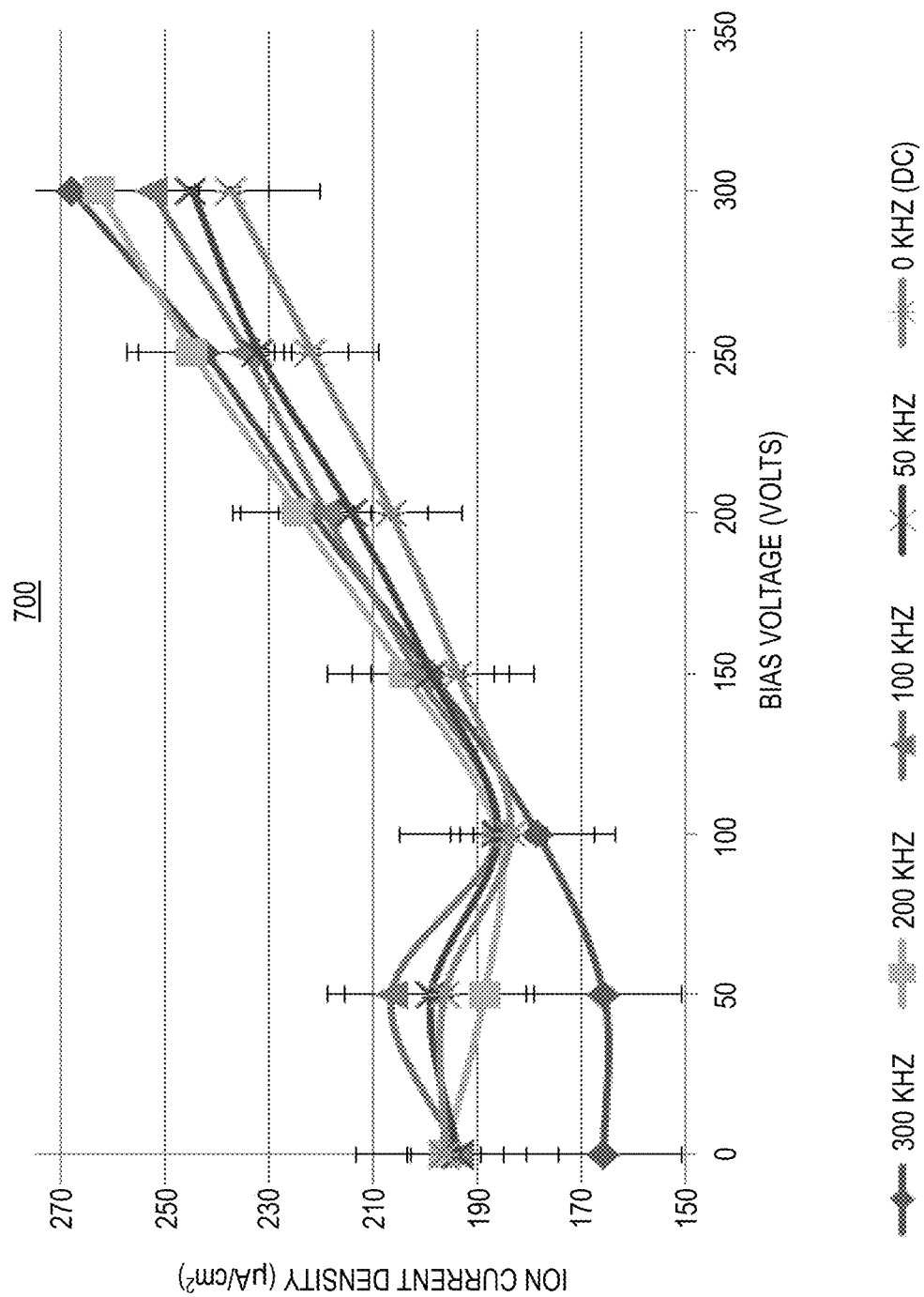
FIG. 7 is a graph depicting an influence of bias voltage and pulse frequency of the bias voltage on an extracted ion current density from the exemplary plasma ion source shown in FIG. 6, according to an illustrative embodiment of the present invention.

FIG. 7 is a graph 700 depicting an influence of bias voltage and pulse frequency of the bias voltage on an extracted ion current density from the exemplary plasma ion source 602 shown in FIG. 6, according to an illustrative embodiment of the present invention. Results represented by the graph 700 shown in FIG. 7 were obtained using a Faraday cup probe disposed downstream of the extraction grid assembly (638 in FIG. 6) in front of the substrate (640 in FIG. 6) at a distance of approximately four inches. The Faraday cup measures ion current density (in $\mu A/cm^2$) extracted from the plasma ion source (602 in FIG. 6). The measured ion current density was plotted against bias voltage level (in volts) for a number of different pulse frequencies (in KHz), namely 300 KHz, 200 KHz, 100 KHz, 50 KHz and 0 KHz (i.e., DC), of the bias power supply (630 in FIG. 6), as illustrated in the graph 700 of FIG. 7. In this example, the plasma ion source 602 was operated with Argon as the feed gas, which was delivered through the gas feed tube 634 (FIG. 6). The RF generator 618 (e.g., Advanced Energy Litmas® RPS 1501) delivered 1,000 Watts to the inductive antenna 610 (FIG. 6). The ion current density collected by the Faraday cup probe was recorded with an ammeter disposed outside of the vacuum chamber.

The exemplary results shown in FIG. 7 illustrate that the ion current density can be varied by application of a bias voltage and is more or less linear in a range of about 100 volts to 300 volts, over a frequency range of about 0 KHz (i.e., DC) to 300 KHz. For one skilled in the art, these findings evidence the ability to adjust the ion energy produced by a plasma ion source in accordance with embodiments of the invention in order to tailor film properties without the requirement for secondary biasing on a substrate.

Example 3

Figure 8:
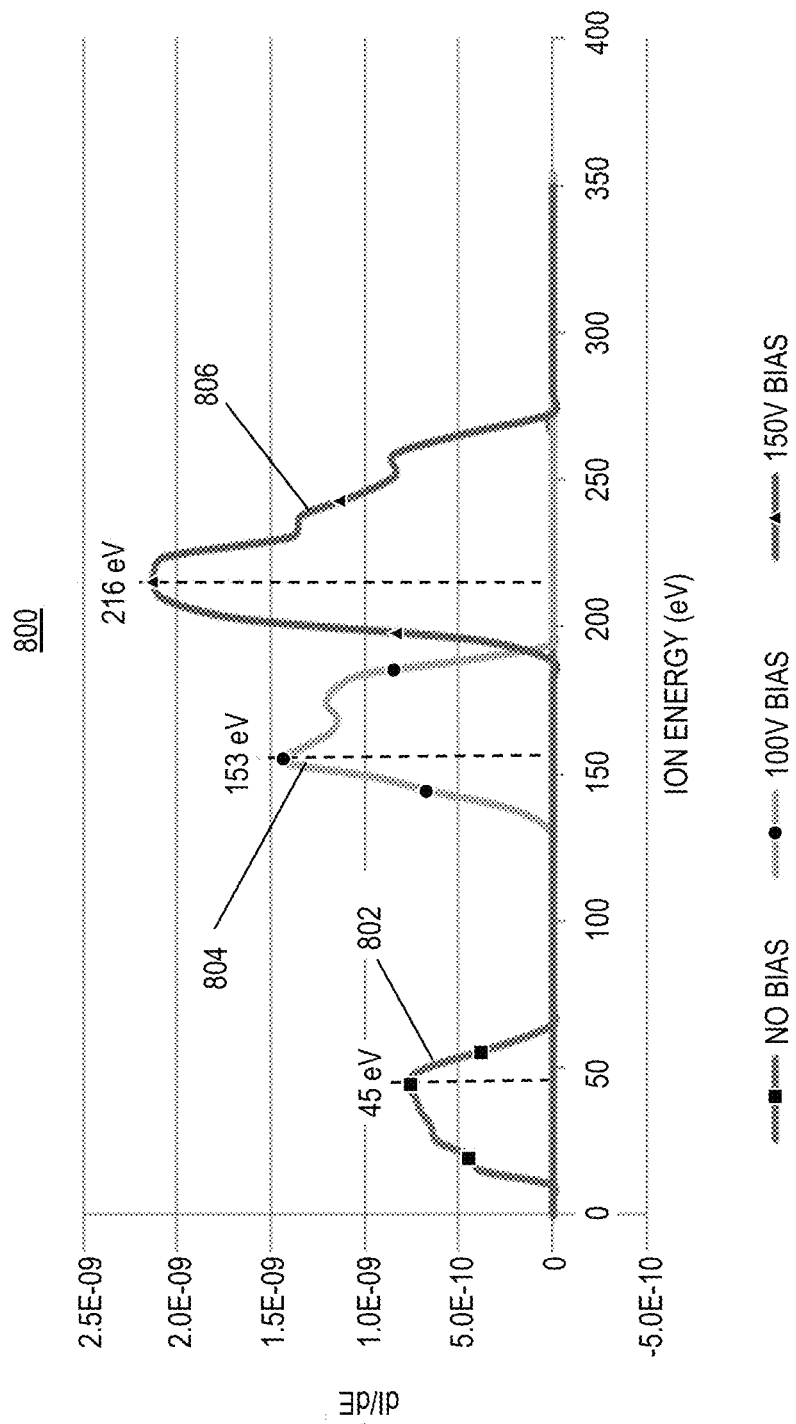
FIG. 8 is a graph depicting an influence of bias voltage on ion energy from the exemplary plasma ion source shown in FIG. 6, according to an illustrative embodiment of the present invention.

FIG. 8 is a graph 800 depicting an influence of bias voltage on ion energy from the exemplary plasma ion source 602 shown in FIG. 6, according to an illustrative embodiment of the present invention. Ion energy distribution (dI/dE) results represented by the graph 800 shown in FIG. 8 were obtained by measuring ion energy (in eV) using a retarding field energy analyzer (RFEA), for example, manufactured by Impedans Ltd. of Dublin, Ireland, disposed downstream of the extraction grid assembly (638 in FIG. 6) in front of the substrate (640 in FIG. 6). The plasma ion source 602 (FIG. 6) was operated with an argon feed gas flow rate of 80 sccm at an operational pressure of 15 mTorr with an RF power of 500 watts applied to the inductive antenna 610 (FIG. 6).

An average ion energy of about 45 eV was measured when no bias voltage was applied to the plasma chamber body 604 (FIG. 6), and the ion energy distribution is represented by waveform 802 as shown in FIG. 8. After the application of a bias voltage of 100 volts from the bias power supply 630 (FIG. 6), the average ion energy as measured by the RFEA was about 153 eV, as indicated by ion energy distribution waveform 804 shown in FIG. 8. The bias power supply 630 (FIG. 6) was increased to a bias voltage of 150 volts and the average ion energy was measured to be about 216 eV, as represented by ion energy distribution waveform 806 shown in FIG. 8.

The information shown in FIG. 8 substantiates the capability of this invention to selectively control the energy of ions by the methods described in this disclosure. Specifically, without the application of a bias voltage (indicated as "No Bias" in FIG. 8), the mean ion energy was measured to be about 45 eV, as shown in the ion energy distribution waveform 802. With the application of a bias voltage of 100 V, the mean ion energy is increased from about 45 eV to 153 eV, as shown in the ion energy waveform 804. The net difference between mean ion energy of a 100 V bias and no bias (0 V) is about 108 eV, which is essentially equal to the applied bias voltage of 100 V. For the case of a 150 V bias voltage, the mean ion energy is measured to be about 216 eV, as shown in the ion energy distribution waveform 806. The net difference between a bias of 150 V and no bias (0 V) is 171 eV, which is roughly equal to 150 eV. An advantage of embodiments of the invention over a conventional ion source is the ability to adjust the mean ion energy of extracted ions controllably without the requirement for an auxiliary neutralizer or a more complicated and expensive multi-grid extraction system.

Given the discussion thus far, it will be appreciated that an exemplary plasma ion source, according to an embodiment of the invention, includes a plasma chamber body electrically isolated from a vacuum chamber to which the plasma chamber body is attached. The plasma chamber body serves as an electrode of the plasma ion source and is adapted to receive a bias voltage applied thereto. An inductive antenna is disposed in an interior of the plasma chamber body and is configured to supply a source of electromagnetic energy to an interior of the plasma chamber body. The antenna sustains a plasma discharge confined therein as a function of an RF voltage supplied to the antenna. The bias voltage applied to the plasma chamber body supplies an electrostatic potential to charged species in the plasma discharge. The plasma ion source further includes an extraction grid disposed at an end of the plasma chamber body opposite the inductive antenna. The extraction grid is at a same voltage potential as the vacuum chamber. A difference in potential between the extraction grid and the plasma chamber body is configured to accelerate the charged species in the plasma discharge out of the extraction grid to thereby generate an output quasi-neutral plasma ion beam. The bias voltage applied to the plasma chamber body includes a portion of the RF voltage supplied to the antenna combined with a pulsed DC voltage.

Given the discussion thus far, it will also be appreciated that a method for generating a linearized energetic plasma ion beam for depositing a thin film coating on a large area substrate surface is provided, according to an embodiment of the invention. The method includes providing a plasma ion source comprising: a plasma chamber body electrically isolated from a vacuum chamber to which the plasma chamber body is attached, the plasma chamber body serving as an electrode of the plasma ion source and being adapted to receive a bias voltage applied thereto; an inductive antenna disposed in an interior of the plasma chamber body and configured to supply a source of electromagnetic energy to an interior of the plasma chamber body, the antenna sustaining a plasma discharge confined therein, the bias voltage applied to the plasma chamber body supplying an electrostatic potential to charged species in the plasma discharge; and an extraction grid disposed at an end of the plasma chamber body opposite the inductive antenna, the extraction grid being at a same voltage potential as the vacuum chamber, a difference in potential between the extraction grid and the plasma chamber body being configured to accelerate the charged species in the plasma discharge out of the extraction grid to generate an output quasi-neutral plasma ion beam. The method further includes applying an RF voltage to the inductive antenna, the plasma discharge being generated as a function of a level of the RF voltage, generating the bias voltage applied to the plasma chamber body by combining a portion of the RF voltage supplied to the inductive antenna with a pulsed DC voltage, and independently controlling ion current density and ion energy of the plasma ion beam. The ion current density is controlled as a function of a level of the RF voltage applied to the inductive antenna, and the ion energy is controlled as a function of a level of the pulsed DC voltage.

Given the discussion thus far, it will be further appreciated that an apparatus for depositing a thin film coating over a large area by PECVD, according to an embodiment of the invention, includes a linearized energetic plasma ion source, an RF generator coupled with the plasma ion source, a bias mixer coupled with the plasma ion source, a bias power supply coupled with the bias mixer, and a precursor gas manifold disposed between the plasma ion source and a substrate surface to be coated.

The plasma ion source includes a plasma chamber body electrically isolated from a vacuum chamber to which the plasma chamber body is attached, the plasma chamber body serving as an electrode of the plasma ion source and being adapted to receive a bias voltage applied thereto. An inductive antenna is disposed in an interior of the plasma chamber body and is configured to supply a source of electromagnetic energy to an interior of the plasma chamber body, the antenna sustaining a plasma discharge confined therein as a function of an RF voltage supplied to the antenna. The bias voltage applied to the plasma chamber body supplies an electrostatic potential to charged species in the plasma discharge. The plasma ion source further includes an extraction grid disposed at an end of the plasma chamber body opposite the inductive antenna, the extraction grid being at a same voltage potential as the vacuum chamber. A difference in potential between the extraction grid and the plasma chamber body is configured to accelerate the charged species in the plasma discharge out of the extraction grid to thereby generate a quasi-neutral plasma ion beam.

The RF generator in the apparatus is configured to generate the RF voltage supplied to the inductive antenna. The bias mixer in the apparatus is configured to combine a portion of the RF voltage supplied to the inductive antenna with a pulsed DC voltage to generate the bias voltage applied to the plasma chamber body. The bias power supply in the apparatus is configured to generate the pulsed DC voltage supplied to the bias mixer. The precursor gas manifold in the apparatus is adapted to receive a precursor gas supplied to the apparatus, the precursor gas interacting with the plasma ion beam to deposit the thin film coating on the substrate surface.

The illustrations of embodiments of the invention described herein are intended to provide a general understanding of the various embodiments, and they are not intended to serve as a complete description of all the elements and features of apparatus, methods and systems that might make use of the techniques described herein. Many other embodiments will become apparent to those skilled in the art given the teachings herein; other embodiments are utilized and derived therefrom, such that structural and logical substitutions and changes can be made without departing from the scope and spirit of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "upper," "top," "lower," "bottom," "front" and "back," where used, are intended to indicate relative positioning of elements or structures to each other when such elements are oriented in a particular manner, as opposed to defining an absolute position of the elements.

The corresponding structures, materials, acts, and equivalents of all means or step-plus-function elements in the claims below, as may be used, are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus, the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments shown and described herein, and that various other changes and modifications are made therein by one skilled in the art without departing from the scope of the appended claims.

What is claimed is:

1. A linearized energetic plasma ion source, comprising:
   a plasma chamber body electrically isolated from a vacuum chamber to which the plasma chamber body is attached, the plasma chamber body serving as an electrode of the plasma ion source and being adapted to receive a bias voltage applied thereto;
   an inductive antenna disposed in an interior of the plasma chamber body and being configured to supply a source of electromagnetic energy to an interior of the plasma chamber body, the antenna sustaining a plasma discharge confined therein as a function of a radio frequency (RF) voltage supplied to the antenna, the bias voltage applied to the plasma chamber body supplying an electrostatic potential to charged species in the plasma discharge; and
   an extraction grid disposed at an end of the plasma chamber body opposite the inductive antenna, the extraction grid being at a same voltage potential as the vacuum chamber, a difference in potential between the extraction grid and the plasma chamber body being configured to accelerate the charged species in the plasma discharge out of the extraction grid to generate an output quasi-neutral plasma ion beam;
   wherein the bias voltage applied to the plasma chamber body comprises a portion of the RF voltage supplied to the antenna combined with a pulsed direct current (DC) voltage.

2. The plasma ion source according to claim 1, wherein the plasma chamber body is formed of an electrically conductive material and is shaped substantially as a hollow rectangular cuboid.

3. The plasma ion source according to claim 1, wherein the plasma chamber body is electrically isolated from the vacuum chamber using an insulating vacuum flange disposed between the plasma chamber body and the vacuum chamber.

4. The plasma ion source according to claim 3, wherein the insulating vacuum flange comprises at least one of a rigid ceramic material, a rigid polymeric material and a rigid glassy material.

5. The plasma ion source according to claim 3, wherein the insulating vacuum flange comprises a rigid material having a dielectric constant greater than about 3.0 at 1.0 megahertz, having an RF dissipation factor of less than about 0.0015 at 1.0 megahertz, having a compressive stress of greater than about 150 megapascals, and having a volume resistivity of greater than about $10^{14}$ ohm-cm.

6. The plasma ion source according to claim 1, further comprising at least one cooling channel, through which a cooling fluid or gas flows, disposed in thermal contact with at least one sidewall of the plasma chamber body, the cooling channel being adapted to transfer heat away from the plasma chamber body.

7. The plasma ion source according to claim 6, wherein the at least one cooling channel is at least one of integrated into the at least one sidewall of the plasma chamber body and affixed to an external surface of the at least one sidewall of the plasma chamber body.

8. The plasma ion source according to claim 1, wherein the extraction grid comprises:
a plurality of electrically conductive rods; and
an extraction grid assembly having an opening therein and being adapted to support the plurality of electrically conductive rods, the plurality of electrically conductive rods being distributed across the opening of the extraction grid assembly.

9. The plasma ion source according to claim 8, wherein the plurality of electrically conductive rods is electrically isolated from the plasma chamber body.

10. The plasma ion source according to claim 1, further comprising an electrostatic shield surrounding the inductive antenna, the electrostatic shield being disposed between the inductive antenna and the plasma chamber body.

11. The plasma ion source according to claim 1, wherein the inductive antenna comprises a plurality of windings, the inductive antenna having a shape substantially matching a shape of the plasma chamber body.

12. The plasma ion source according to claim 11, wherein the windings of the inductive antenna are formed of a hollow conductive material through which a cooling fluid or gas flows for transferring heat away from the inductive antenna.

13. The plasma ion source according to claim 11, wherein a first portion of the windings of the inductive antenna is disposed within the plasma chamber body and a second portion of the windings of the inductive antenna is disposed external to the plasma chamber body, the plasma discharge being confined within an interior space between the first portion of the windings, and wherein the inductive antenna comprises an electrical insulator encasing at least the first portion of the windings exposed to the plasma discharge, the electrical insulator protecting the windings of the inductive antenna from being sputtered.

14. The plasma ion source according to claim 13, wherein the electrical insulator encasing at least the first portion of the windings comprises aluminum oxide tubing surrounding at least the first portion of the windings of the inductive antenna.

15. The plasma ion source according to claim 1, wherein the inductive antenna is electrically isolated from the plasma chamber body.

16. The plasma ion source according to claim 1, further comprising a bias mixer coupled with the plasma chamber body, the bias mixer combining a portion of the RF voltage supplied to the inductive antenna with a pulsed direct current (DC) voltage to generate the bias voltage applied to the plasma chamber body.

17. The plasma ion source according to claim 16, further comprising a voltage divider coupled with the bias mixer, the voltage divider being configured to receive the RF voltage applied to the inductive antenna and to generate an attenuated RF voltage which, when combined with the pulsed DC voltage, forms the bias voltage applied to the plasma chamber body.

18. The plasma ion source according to claim 17, wherein the voltage divider is coupled with the bias mixer and the inductive antenna using first and second shielded connections, respectively, and the bias mixer is coupled with the plasma chamber body using a third shielded connection.

19. The plasma ion source according to claim 16, wherein the bias mixer is configured to combine the portion of the RF voltage supplied to the antenna and the pulsed DC voltage such that ion current density and ion energy of the output quasi-neutral plasma ion beam are independently controlled, the ion current density being controlled as a function of the portion of the RF voltage supplied to the antenna and the ion energy being controlled as a function of the pulsed DC voltage.

20. The plasma ion source according to claim 1, wherein the extraction grid comprises at least one cooling channel, through which a cooling fluid or gas flows, the cooling channel being adapted to transfer heat away from the extraction grid.

21. The plasma ion source according to claim 1, further comprising at least one of an electromagnet and a permanent magnet array disposed around the plasma chamber body, the at least one of the electromagnet and the permanent magnet array generating a magnetic field in an interior of the plasma chamber body which increases a plasma density of the plasma discharge generated by the inductive antenna.

22. The plasma ion source according to claim 21, wherein the magnetic field generated by the at least one of the electromagnet and the permanent magnet array is configured to selectively control a thin film deposition rate of the plasma ion source.

23. The plasma ion source according to claim 1, wherein the plasma chamber body comprises at least one inlet for introducing a feed gas to an interior of the plasma chamber body, the plasma discharge being generated from the feed gas.

24. An apparatus for depositing a thin film coating over a large area by plasma-enhanced chemical vapor deposition, the apparatus comprising:
a linearized energetic plasma ion source, the plasma ion source comprising:
a plasma chamber body electrically isolated from a vacuum chamber to which the plasma chamber body is attached, the plasma chamber body serving as an electrode of the plasma ion source and being adapted to receive a bias voltage applied thereto;
an inductive antenna disposed in an interior of the plasma chamber body and being configured to supply a source of electromagnetic energy to an interior of the plasma chamber body, the antenna sustaining a plasma discharge confined therein as a function of a radio frequency (RF) voltage supplied to the antenna, the bias voltage applied to the plasma chamber body supplying an electrostatic potential to charged species in the plasma discharge; and
an extraction grid disposed at an end of the plasma chamber body opposite the inductive antenna, the extraction grid being at a same voltage potential as the vacuum chamber, a difference in potential between the extraction grid and the plasma chamber body being configured to accelerate the charged species in the plasma discharge out of the extraction grid to generate a quasi-neutral plasma ion beam;

an RF generator coupled with the plasma ion source, the RF generator generating the RF voltage supplied to the inductive antenna;

a bias mixer coupled with the plasma ion source, the bias mixer combining a portion of the RF voltage supplied to the inductive antenna with a pulsed direct current (DC) voltage to generate the bias voltage applied to the plasma chamber body;

a bias power supply coupled with the bias mixer, the bias power supply generating the pulsed DC voltage supplied to the bias mixer; and a precursor gas manifold disposed between the plasma ion source and a substrate surface to be coated, the precursor gas manifold being adapted to receive a precursor gas supplied to the apparatus, the precursor gas interacting with the plasma ion beam to deposit the thin film coating on the substrate surface.

25. A method for generating a linearized energetic plasma ion beam for depositing a thin film coating on a large area substrate surface, the method comprising:

providing a plasma ion source comprising:

a plasma chamber body electrically isolated from a vacuum chamber to which the plasma chamber body is attached, the plasma chamber body serving as an electrode of the plasma ion source and being adapted to receive a bias voltage applied thereto;

an inductive antenna disposed in an interior of the plasma chamber body and configured to supply a source of electromagnetic energy to an interior of the plasma chamber body, the antenna sustaining a plasma discharge confined therein, the bias voltage applied to the plasma chamber body supplying an electrostatic potential to charged species in the plasma discharge; and an extraction grid disposed at an end of the plasma chamber body opposite the inductive antenna, the extraction grid being at a same voltage potential as the vacuum chamber, a difference in potential between the extraction grid and the plasma chamber body being configured to accelerate the charged species in the plasma discharge out of the extraction grid to generate an output quasi-neutral plasma ion beam;

applying a radio frequency (RF) voltage to the inductive antenna, the plasma discharge being generated as a function of a level of the RF voltage;

generating the bias voltage applied to the plasma chamber body by combining a portion of the RF voltage supplied to the inductive antenna with a pulsed direct current (DC) voltage; and independently controlling ion current density and ion energy of the plasma ion beam, the ion current density being controlled as a function of a level of the RF voltage applied to the inductive antenna, and the ion energy being controlled as a function of a level of the pulsed DC voltage.

* * * * *